(12) United States Patent
Peng

(10) Patent No.: US 6,970,356 B2
(45) Date of Patent: Nov. 29, 2005

(54) HEAT SINK SYSTEM

(76) Inventor: Tseng Jyi Peng, Ranger, Fl 9, Bldg 1, 889 Yishan Rd., 200233 Shanghai (CN)

( * ) Notice: Subject to any disclaimer, the term of this patent is extended or adjusted under 35 U.S.C. 154(b) by 245 days.

(21) Appl. No.: 10/616,181

(22) Filed: Jul. 9, 2003

(65) Prior Publication Data

US 2004/0070939 A1    Apr. 15, 2004

Related U.S. Application Data

(60) Provisional application No. 60/396,434, filed on Jul. 16, 2002.

(51) Int. Cl.[7] ............................................. H05K 7/20
(52) U.S. Cl. ...................... 361/695; 361/687; 365/121; 174/15.1; 174/16.3
(58) Field of Search ................................ 361/600–605, 361/583, 686–689, 692–695, 704–712, 801–816, 361/715–719; 165/80.2, 80.3, 80.4, 185; 174/15.1, 16.2, 252, 35 RG; 313/499, 500, 313/501, 503, 581, 583, 495, 512; 315/169.3, 315/169.4; 455/3.01, 3.02, 3.05, 73, 99, 128, 455/130, 78, 67.5, 82; 219/203, 209.05

(56) References Cited

U.S. PATENT DOCUMENTS

| | | | |
|---|---|---|---|
| 5,297,005 A | | 3/1994 | Gourdin |
| 5,497,289 A | * | 3/1996 | Sugishima et al. ......... 361/709 |
| 5,535,094 A | | 7/1996 | Nelson |
| 5,650,912 A | | 7/1997 | Katsui |
| 5,831,240 A | * | 11/1998 | Katooka et al. ......... 219/130.1 |
| 5,940,268 A | | 8/1999 | Miyahara |
| 6,320,776 B1 | * | 11/2001 | Kajiura et al. ............... 363/141 |
| 6,639,360 B2 | * | 10/2003 | Roberts et al. ............. 313/512 |
| 6,640,084 B2 | * | 10/2003 | Pande et al. ............... 455/3.01 |
| 2005/0122682 A1 | * | 6/2005 | Streit et al. ................. 361/695 |

* cited by examiner

*Primary Examiner*—Michael Datskovskiy
(74) *Attorney, Agent, or Firm*—Michael C. Olson, Esq.

(57) ABSTRACT

A heat sink assembly is provided to afford cooling for electronic components mounted on a circuit board. The assembly consists of a thermal conducting substrate base with a top and bottom side. Radiating fins are attached to the bottom side of the base. The fins are cooled by external air. The component on the circuit board is connected to the top surface of the heat sink base by means of thermal conducting spacers which create a gap between the bottom surface of the circuit board and the top surface of the heat sink base. A first hole is placed in the heat sink base and driving means are attached to the said base at the area of the first hole. A rotating fan is operatively attached to the said driving means in such a manner that when the fan rotates air is forced between the gap created between the circuit board and the heat sink base. A second hole is installed in the heat sink base. The air flowing from the fan is exhausted through the said second hole. A shield, preferably constructed of RF absorbing materials, is attached to the heat sink base in such a manner as to enclose the circuit board and channel airflow around the spacers.

4 Claims, 3 Drawing Sheets

HEAT SINK SYSTEM

PRIOR APPLICATIONS

Priority is claimed from provisional application No. 60/396,434 filed Jul. 16, 2002.

FEDERALLY SPONSORED RESEARCH

No federal sponsorship or funding was used to develop the subject matter of this application.

BACKGROUND OF THE INVENTION

Amateur radios use power transistors and other components which generate heat that can result in failure of the component and/or other adjacent components. In order to dissipate the heat, an external heat sink has traditionally been used. However, high powered radios in excess of 25 watts of transmitting power, require an extremely large heat sink. This makes such a radio virtually unmarketable for mobile use, where size of the radio is a definite factor in the minds of purchasers.

SUMMARY OF THE INVENTION

An object of the invention is to provide a means for reducing the size of an external heat sink in high powered transceivers.

This is accomplished through the use of spacers to connect the component to be cooled with the heat sink. The spacers are generally cylindrical in shape and of a predetermined dimension such that there is at least a two millimeter gap created between the heat sink and the PC board to which other electronic components are mounted. A fan is used to direct air into the two millimeter or larger space created by the spacers between the heat sink and the part to be cooled. The fan directs cooling air over the base of the heat sink and across the thermal conducting spacers. The heat sink also has radiating fins which are cooled by external air flow.

The use of a cooling fan to cool the heat sink results in airflow throughout the interior of the transceiver case. This can cause dirt, dust or contaminants to be deposited onto components. The deposit of dirt, dust or contaminants can result in premature failure of the components. A further objective of the present invention is to reduce the deposit of dirt on components of the transceiver not being cooled by the heat sink system.

This is accomplished through the use of a shield around the PC board upon which the part to be cooled is mounted. In the preferred embodiment, the shield completely surrounds the part to be cooled, and the printed circuit board on which said part is mounted, thereby preventing air from the cooling fan from flowing onto parts that are not intended to be cooled by the heat sink system. In addition, a plate is installed over one half of the radiating fins in direct relation to the cooling fan which reduces the amount of dirt, dust and contaminants taken in and then dispersed by the fan. It also provides a measure of protection against injury in that it reduces the risk of contact with the blades of the fan.

An additional benefit of the shield is the channeling of airflow from the fan over the spacers. This results in increased cooling efficiency.

An additional benefit of the shield is the prevention of unwanted radio frequency interference by the parts being cooled. The shield can be made of an RF absorbing material such as nickel-zinc.

In another embodiment, the shield can be made without a top. The printed circuit board is disposed over the shield. This allows for channeling of the airflow in the space created by the spacers and prevents dirt and contaminants from flowing onto other nearby components.

DETAILED DESCRIPTION OF THE INVENTION

The preferred imbodiment of the present invention will be described with reference to FIGS. 2a and 2b.

Figure 1:
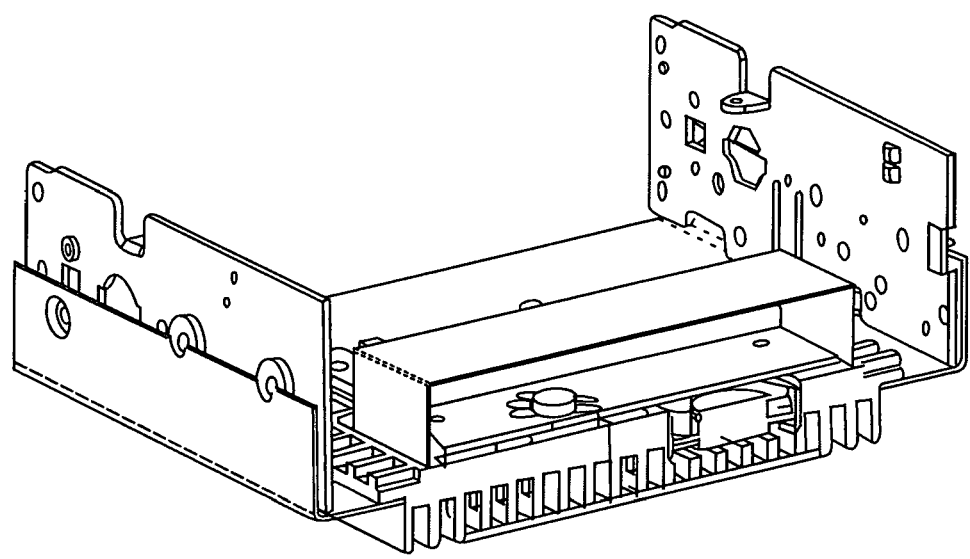
FIG. 1 is a cross sectional view of the heat sink system according to the preferred embodiment of the present invention.
Figure 2A:
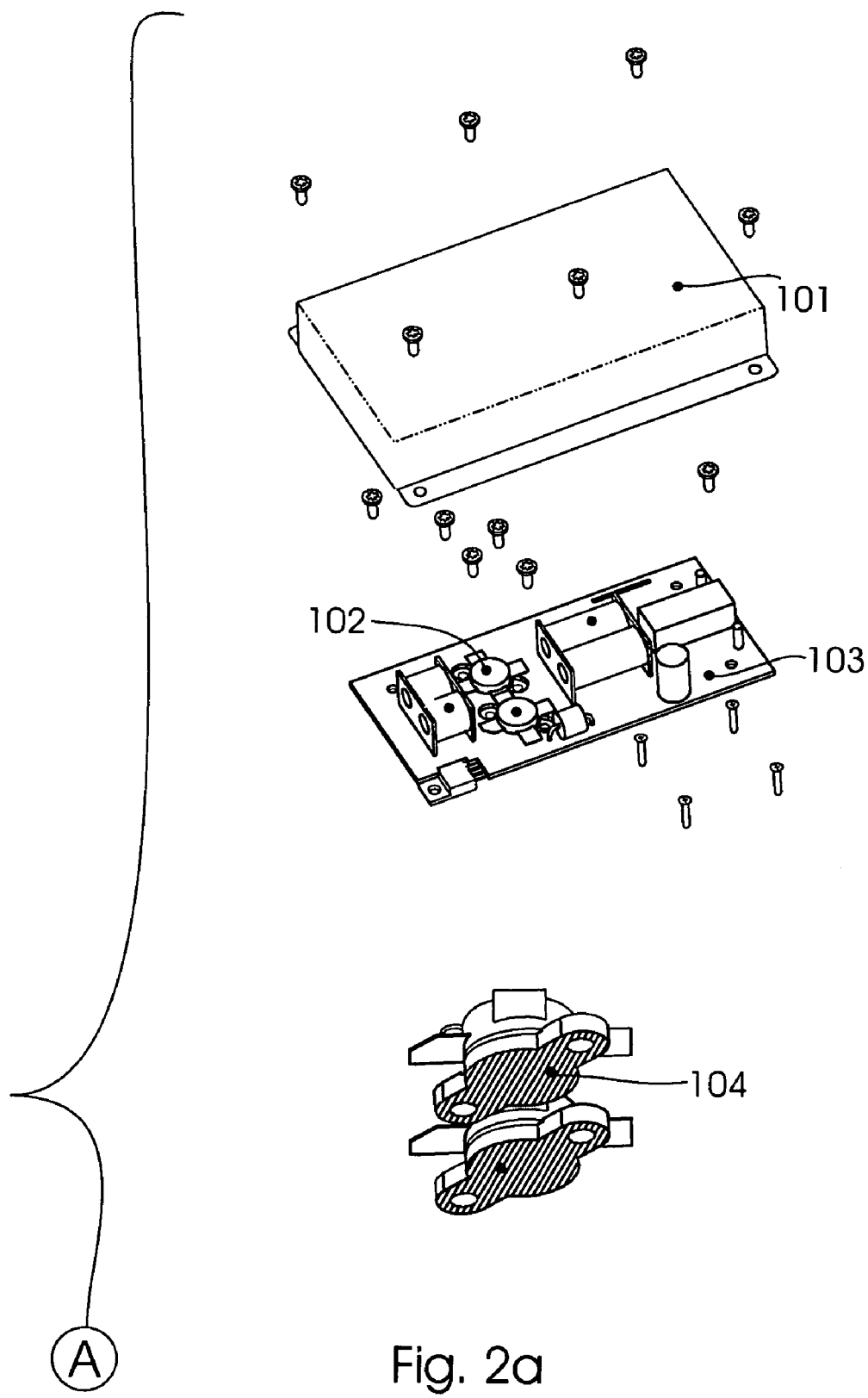
FIGS. 2a and 2b are an exploded view of the heat sink system according to the preferred embodiment of the present invention.
Figure 2B:
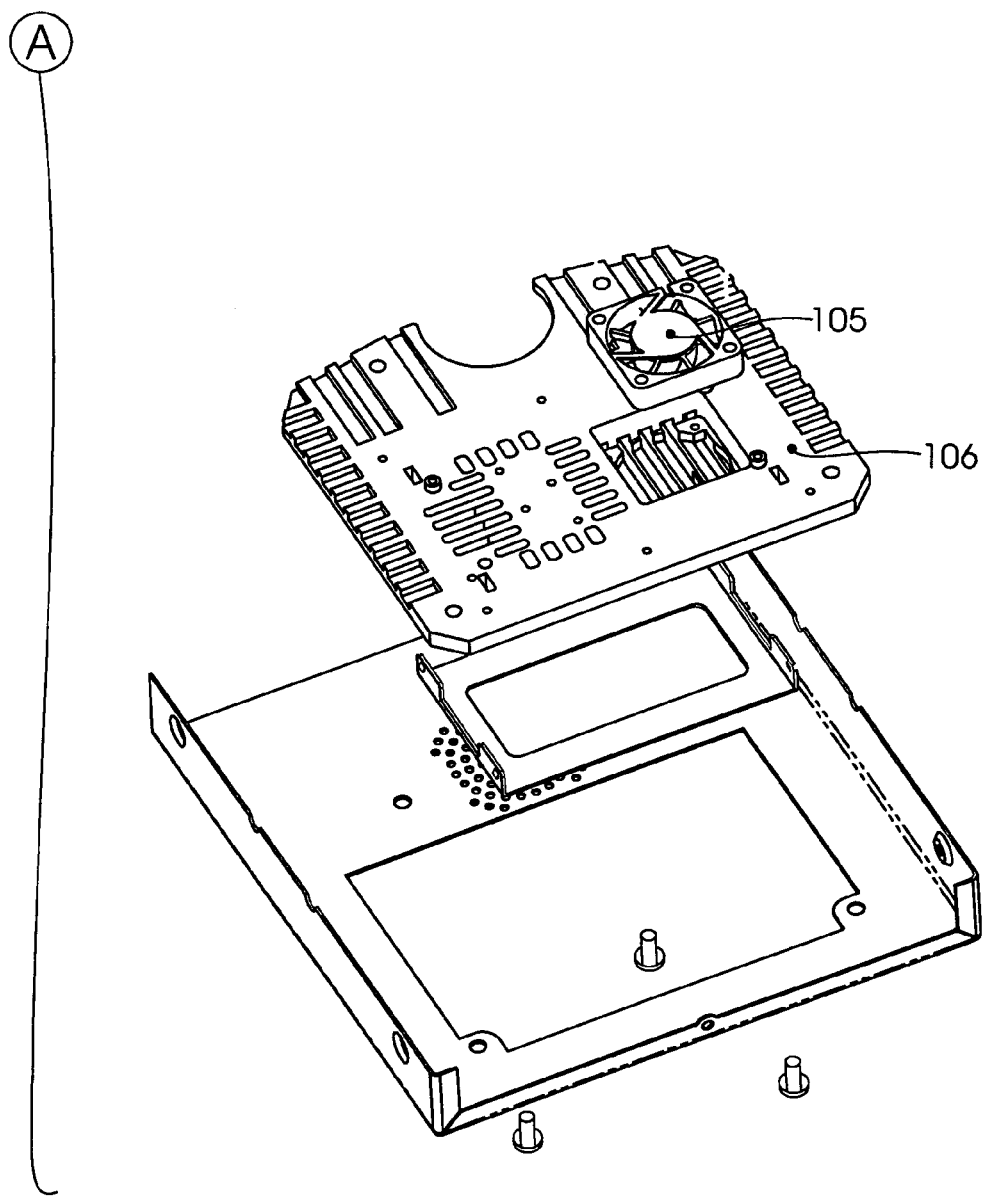

In FIGS. 2a and 2b, an exploded view of the invention is seen. The component to be cooled(102) is isolated to a printed circuit board(103) separated from those components which need not be cooled but are intended to be protected from dirt, dust and contaminants. The component to be cooled(102) is attached to a heat sink(106) by means of spacers (104). The spacers(104) may be made of aluminum, copper or other thermal conducting material. The spacers (104) create a space between the component to be cooled (102) and the heat sink(106).

The heat sink(106) consists of a base with a top and bottom surface. The spacers (104) are connected to the top surface of the heat sink(106). Radiating fins project from the bottom surface of the heat sink base(106) and are cooled by external air. The base of the heat sink(106) has a first opening off center of sufficient size for a motor and fan assembly(105) to be installed. A motor is mounted to the opening. A fan is operatively connected to the motor such that air is forced by the fan into the space created by the spacer(104) between the base(106) and the component to be cooled(102). The heat sink base(106) also has a second opening, off center and opposite of center to the first opening, through which air may be exhausted to the exterior environment.

The fan(105) when operating should be installed such that external air is drawn into the first opening created in the base of the heat sink(106) and flows over the top base of the heat sink(106) through the space created by the spacers(104). The heated air is then exhausted through the second opening.

A shield(101) is installed around the printed circuit board (103) upon which is mounted the part to be cooled(102). The shield(101) should have at least one side wall and a top wall. In the preferred embodiment there are four side walls with each side wall connected to the top wall and the heat sink(106).

What is claimed is:

1. A heat sink system comprising:
   a circuit board having a top surface and a bottom surface;
   a component to be cooled which is mounted on the top surface of said circuit board;
   a substrate base made from a thermal conducting material and containing a top surface and a bottom surface with a first opening extending from said top surface through the base to said bottom surface of the base and a second opening from said top surface through the base to said bottom surface of the base;

a thermal conducting spacer of predetermined dimensions with a proximal and distal end, the proximal end being connected to said component at the bottom surface of said circuit board and the distal end being connected to the top surface of said substrate base;

a plurality of fins vertically projecting from the bottom surface of the said substrate base;

driving means at least a part of which is installed in said first opening of the substrate base and which is at least partially supported by the said substrate base;

a fan rotated by said driving means whereby air is drawn by the fan through the first said opening in the substrate base and flows over the top surface of the base and exits through the second said opening of the substrate base.

2. A heat sink system comprising:

a circuit board having a top surface and a bottom surface;

a component to be cooled which is mounted on the top surface of said circuit board;

a substrate base made from a thermal conducting material and containing a top surface and a bottom surface with a first opening extending from said top surface through the base to said bottom surface of the base and a second opening from said top surface through the base to said bottom surface of the base;

a thermal conducting spacer of predetermined dimensions with a proximal and distal end, the proximal end being connected to said component at the bottom surface of said circuit board and the distal end being connected to the top surface of said substrate base;

a plurality of fins vertically projecting from the bottom surface of the said substrate base;

driving means at least a part of which is installed in said first opening of the substrate base and which is at least partially supported by the said substrate base;

a fan rotated by said driving means whereby air is drawn by the fan through the first said opening in the substrate base and flows over the top surface of the base and exits through the second said opening of the substrate base;

a shield with at least one side wall and a top wall disposed over said side wall said shield being disposed over the top surface of the printed circuit board.

3. The heat sink system of claim 2 where the shield is made out of radio frequency absorbing materials.

4. A heat sink system comprising:

a circuit board having a top surface and a bottom surface;

a component to be cooled which is mounted on the top surface of said circuit board;

a substrate base made from a thermal conducting material and containing a top surface and a bottom surface with a first opening extending from said top surface through the base to said bottom surface of the base and a second opening from said top surface through the base to said bottom surface of the base;

a thermal conducting spacer of predetermined dimensions with a proximal and distal end, the proximal end being connected to said component at the bottom surface of said circuit board and the distal end being connected to the top surface of said substrate base;

a plurality of fins vertically projecting from the bottom surface of the said substrate base;

driving means at least a part of which is installed in said first opening of the substrate base and which is at least partially supported by the said substrate base;

a fan rotated by said driving means whereby air is drawn by the fan through the first said opening in the substrate base and flows over the top surface of the base and exits through the second said opening of the substrate base;

a generally rectangular shaped shield with at least one side wall shield, the said printed circuit board being disposed over said shield.

* * * * *